United States Patent
Ueno et al.

(10) Patent No.: US 6,400,644 B1
(45) Date of Patent: Jun. 4, 2002

(54) SEMICONDUCTOR CONTROL UNIT

(75) Inventors: Hiroya Ueno; Junji Nakatsuka, both of Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/616,945

(22) Filed: Jul. 14, 2000

(30) Foreign Application Priority Data

Jul. 21, 1999 (JP) .......................................... 11-205907

(51) Int. Cl.[7] ................................................. G11C 8/00
(52) U.S. Cl. ........................... 365/239; 365/194; 345/99
(58) Field of Search ....................... 365/230.06, 230.09, 365/239, 194; 345/98, 99, 100

(56) References Cited

U.S. PATENT DOCUMENTS

| | | | |
|---|---|---|---|
| 4,679,176 A | * 7/1987 | Ogawa et al. | 367/119 |
| 4,885,740 A | 12/1989 | Parson et al. | 370/60 |
| 5,724,170 A | * 3/1998 | Aizawa | 359/187 |
| 5,822,386 A | 10/1998 | Pawelski | 375/373 |
| 5,898,605 A | * 4/1999 | Smarandoiu et al. | 365/45 |
| 5,973,949 A | * 10/1999 | Kramer et al. | 365/49 |
| 5,973,959 A | * 10/1999 | Gerna et al. | 365/185.03 |
| 6,049,321 A | * 4/2000 | Sasaki | 345/99 |
| 6,061,279 A | * 5/2000 | Toda et al. | 365/194 |
| 6,292,162 B1 | * 9/2001 | Shiki | 345/98 |

FOREIGN PATENT DOCUMENTS

| | | | |
|---|---|---|---|
| JP | 1160113 A | * | 6/1989 |
| JP | 6085668 A | * | 3/1994 |
| JP | 06224950 A | * | 8/1994 |

* cited by examiner

*Primary Examiner*—Richard Elms
*Assistant Examiner*—Hien Nguyen
(74) *Attorney, Agent, or Firm*—McDermott, Will & Emery

(57) ABSTRACT

A control unit includes sample-and-hold circuits, their associated switching circuits and a switch controller. Each of the sample-and-hold circuits includes a switch. The switch controller sequentially outputs switch control signals one after another to the sample-and-hold circuits. For example, at a point in time data has been sampled and held in a first one of the sample-and-hold circuits, a first one of the switching circuits outputs a CLOSED signal to a second one of the switching circuits via a signal line. The second switching circuit does not output the switch control signal, received from the switch controller, to a second one of the sample-and-hold circuits until the second switching circuit receives the CLOSED signal from the first switching circuit. Accordingly, while one of the sample-and-hold circuits is sampling and holding the data, none of the other sample-and-hold circuits is allowed to open its switch. As a result, each sample-and-hold circuit can sample and hold the data accurately without being affected by the switching noise caused by the switching of any other sample-and-hold circuit.

12 Claims, 14 Drawing Sheets

SEMICONDUCTOR CONTROL UNIT

BACKGROUND OF THE INVENTION

The present invention relates to a semiconductor control unit with multiple sample-and-hold circuits, which is effectively applicable to a mobile telecommunications device like a cellular phone.

In recent years, an automated layout process of semiconductor control units, like placement and routing, has often been carried out using a hardware description language (HDL) such as Verilog.

A mobile telecommunications device such as a cellular phone uses sample-and-hold circuits for retaining a data signal therein. The automated placement and routing techniques are also frequently applied to the design of semiconductor control units of the type including sample-and-hold circuits.

FIG. 12 illustrates an overall arrangement for a known semiconductor control unit including sample-and-hold circuits. As shown in FIG. 12, the control unit includes switch controller 100 and sample-and-hold circuits 110, 120 and 130. The switch controller 100 is connected to, and sequentially outputs switch control signals SH1, SH2 and SH3 to, the sample-and-hold circuits 110, 120 and 130 by way of signal lines 140, 150 and 160, respectively.

FIG. 13 illustrates a detailed circuit configuration for the known semiconductor control unit shown in FIG. 12. The CMOS transistors 112, 122 and 132, functioning as switches (which will be herein called "CMOS switches"), of the sample-and-hold circuits 110, 120 and 130 sequentially open in response to the switch control signals SH1, SH2 and SH3 provided from the switch controller 100, respectively. Synchronously with these switch control signals SH1, SH2 and SH3, data, received at an input terminal DATAIN, is sampled in capacitors 111, 121 and 131 of the sample-and-hold circuits 110, 120 and 130 in this order.

FIG. 14 is a timing diagram illustrating this operation. As shown in FIG. 14, first, the switch control signal SH1 rises to the H level at a time T1, when the CMOS switch 112 of the sample-and-hold circuit 110 opens and the data starts being stored into the capacitor 111. Thereafter, when the switch control signal SH1 falls to the L level at a time T2, the data is sampled and held in the capacitor 111 and the CMOS switch 112 closes.

Next, the switch control signal SH2 rises to the H level at a time T3, when the CMOS switch 122 of the sample-and-hold circuit 120 opens and the data starts being stored into the capacitor 121. Thereafter, when the switch control signal SH2 falls to the L level at a time T4, the data is sampled and held in the capacitor 121 and the CMOS switch 122 closes.

In the same way, when the switch control signal SH3 rises to the H level at a time T5, the CMOS switch 132 of the sample-and-hold circuit 130 opens and the data starts being stored into the capacitor 131. Next, when the switch control signal SH3 falls to the L level at a time T6, the data is sampled and held in the capacitor 131 and the CMOS switch 132 closes. In this manner, the multiple CMOS switches 112, 122 and 132 open and close in turns and the data received at the input terminal DATAIN is sequentially stored into the sample-and-hold circuits 110, 120 and 130 in this order.

Thanks to the recent development of automated placement and routing techniques applicable to the design process of semiconductor devices, the wire lengths of signal lines are now controllable much more precisely than what they used to be. Actually, though, chips fabricated are not exactly the same ones, but show slightly different characteristics one from the other as for the resistance and capacitance of their signal lines. As a result, a signal cannot be transmitted through those lines at an intended transfer rate, either, thus causing signal propagation delays.

FIG. 15 is a timing diagram illustrating a situation where the signal propagation delays are caused. As shown in FIG. 15, the data received at the input terminal DATAIN is superposed with crosstalk noise of a digital signal caused by the switching of the CMOS switches 112, 122 and 132. In addition, the data is also affected by switching noise that has reached after having made a detour inside the substrate.

First, suppose the fall of the switch control signal SH1 has been delayed. In that case, if the next switch control signal SH2 rose to the H level at the time T2 before the switch control signal SH1 falls to the L level at the time T3, then the CMOS switch 122 opens at the time T2. In such a situation, the data received at the input terminal DATAIN is superposed with switching noise. And when the switch control signal SH1 finally falls to the L level at the time T3, the data received at the input terminal DATAIN is sampled and held in the capacitor 111. However, the switching noise $\Delta V$, which was caused due to the switching of the CMOS switch 122, is also sampled and held erroneously in the capacitor 111.

Next, suppose the fall of the switch control signal SH2 has also been delayed. In that case, if the next switch control signal SH3 rose to the H level at the time T4 before the switch control signal SH2 falls to the L level at the time T5, then the CMOS switch 132 opens at the time T4 to cause switching noise. And when the switch control signal SH2 finally falls to the L level at the time T5, the data received at the input terminal DATAIN is sampled and held in the capacitor 121. However, the switching noise $\Delta V$, which was caused due to the switching of the CMOS switch 132, is also sampled and held erroneously in the capacitor 121. As can be seen, switching noise adversely deteriorates the sample-and-hold performance of the known control unit.

SUMMARY OF THE INVENTION

It is therefore an object of the invention to improve the sample-and-hold performance by getting data sampled and held accurately with no switching noise introduced thereto. To achieve this object, while the data is being sampled and held in one of sample-and-hold circuits, a switch in the next sample-and-hold circuit is not allowed to open even if the wire lengths of signal lines between a switch controller and the sample-and-hold circuits are different from each other.

That is to say, according to the present invention, a switch included in one of the sample-and-hold circuits is never allowed to open until the data has been completely held in the previous one of the sample-and-hold circuits.

An inventive semiconductor control unit includes multiple sample-and-hold circuits for storing externally input data therein. Each said sample-and-hold circuit includes a switch for selectively passing the data therethrough. The control unit further includes a controller, connected to the sample-and-hold circuits through respective signal lines, for sequentially outputting switch control signals to the sample-and-hold circuits to get the data stored in one of the sample-and-hold circuits after another. The control unit further includes the same number of switching circuits as the sample-and-hold circuits. The switching circuits are provided for the respective signal lines. Each said switching circuit receives not only a first one of the switch control signals from the controller through its associated signal line but also a state signal from another one of the switching circuits that received a second one of the switch control signals that precedes the first switch control signal. And while the switch of another one of the sample-and-hold circuits that received the second switch control signal is opened, the switching circuit is not allowed to output the first switch control signal to associated one of the sample-and-hold circuits.

In one embodiment of the present invention, each said switching circuit does not output the first switch control signal to the associated sample-and-hold circuit until the switching circuit receives a CLOSED signal as the state signal from the another one of the switching circuits that received the second switch control signal.

In another embodiment of the present invention, each said switching circuit is placed closely to an adjacent one of the switching circuits.

In still another embodiment, all of the sample-and-hold circuits, but one, are each placed between the associated switching circuit and another one of the switching circuits that receives the state signal from the former switching circuit. The one sample-and-hold circuit is adjacent to just the associated sample-and-hold circuit thereof.

In yet another embodiment, the switching circuits are arranged in such a manner that each said switching circuit is spaced apart from another one of the switching circuits that receives the state signal from the former switching circuit by a substantially equal distance.

In the inventive control unit, the switch controller outputs the switch control signals one after another to the sample-and-hold circuits by way of the switching circuits. For example, suppose the first sample-and-hold circuit is going to sample and hold the input data responsive to the first switch control signal. When the first sample-and-hold circuit finishes sampling and holding the data, the first switching circuit outputs the CLOSED signal as the state signal to the second switching circuit. Even if the second switching circuit has already received the second switch control signal from the switch controller before receiving the CLOSED signal, the second switching circuit does not output the second switch control signal to the second sample-and-hold circuit until the second switching circuit receives the CLOSED signal. Accordingly, it is not until the first sample-and-hold circuit finishes sampling and holding the data that the second sample-and-hold circuit opens its switch to start sampling and holding the data. In this manner, the first sample-and-hold circuit can sample and hold the data accurately without being affected by the switching noise resulting from the switching of the second sample-and-hold circuit.

In particular, according to the present invention, two adjacent switching circuits are placed in close proximity and therefore the state signal can be transmitted in a very short time. Thus, the data can be repeatedly and accurately sampled and held at high speeds without being affected by the switching noise.

In addition, according to the present invention, the first sample-and-hold circuit is located between the first and second switching circuits, for example. Thus, after the first switch control signal has been sent out from the first switching circuit to the first sample-and-hold circuit, the state signal (i.e., the CLOSED signal) is transferred from the first to the second switching circuit. In this manner, the state signal (or the CLOSED signal) can be propagated in a short time while getting the data sampled and held accurately by the first sample-and-hold circuit.

In addition, according to the present invention, the switching circuits are spaced apart from each other by a substantially equal distance. Thus, the state signal (CLOSED signal) can be transmitted from each one of the switching circuits to the next in the same amount of time.

DESCRIPTION OF THE PREFERRED EMBODIMENTS

Hereinafter, preferred embodiments of the present invention will be described with reference to the accompanying drawings.

Embodiment 1

Figure 1:
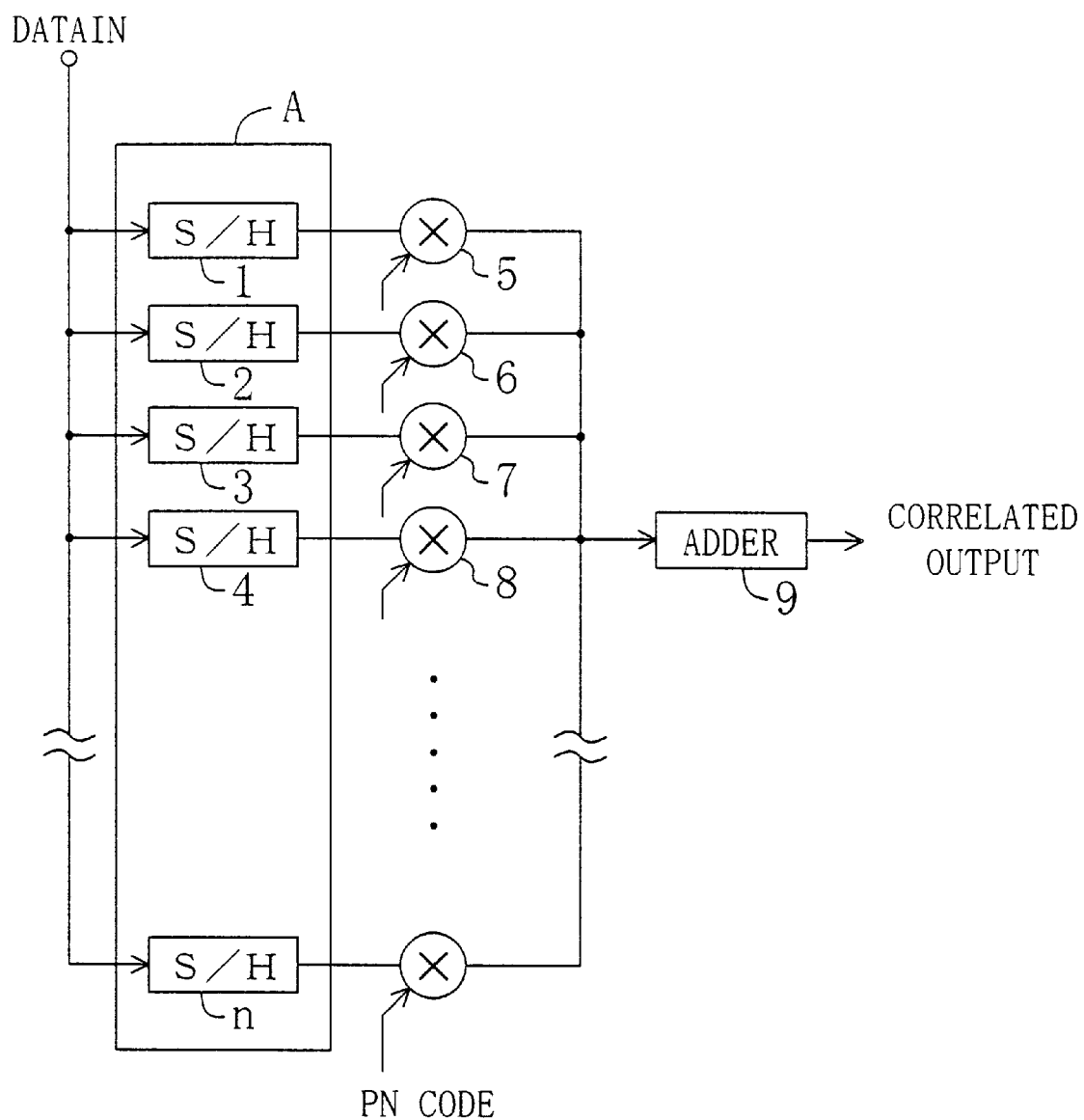
FIG. 1 illustrates a schematic overall arrangement for a matched filter to which the inventive semiconductor control unit is applied.

FIG. 1 illustrates a double code division multiple access (W-CDMA) matched filter to which an inventive semiconductor control unit, including multiple sample-and-hold circuits, is applicable.

As shown in FIG. 1, externally input data is received at an input terminal DATAIN and then delivered to the inventive semiconductor control unit A including a number n of sample-and-hold circuits 1, 2, 3, 4, . . . , n for sequentially storing the data therein. The same number n of multipliers 5, 6, 7, 8, . . . , m are also provided for the respective sample-and-hold circuits 1 through n. Each of these multipliers 5 through m multiplies together the data, which has been sampled and held by its associated sample-and-hold circuit, and a pseudo-random noise (PN) code (i.e., data encryption key for use in spread spectrum transmission). An adder 9 is further provided to add the products obtained by the number n of multipliers 5 through m together. If the data received at the input terminal DATAIN matches with the PN code, then the output of the adder 9 will be a correlated output with a predetermined value.

Figure 2:
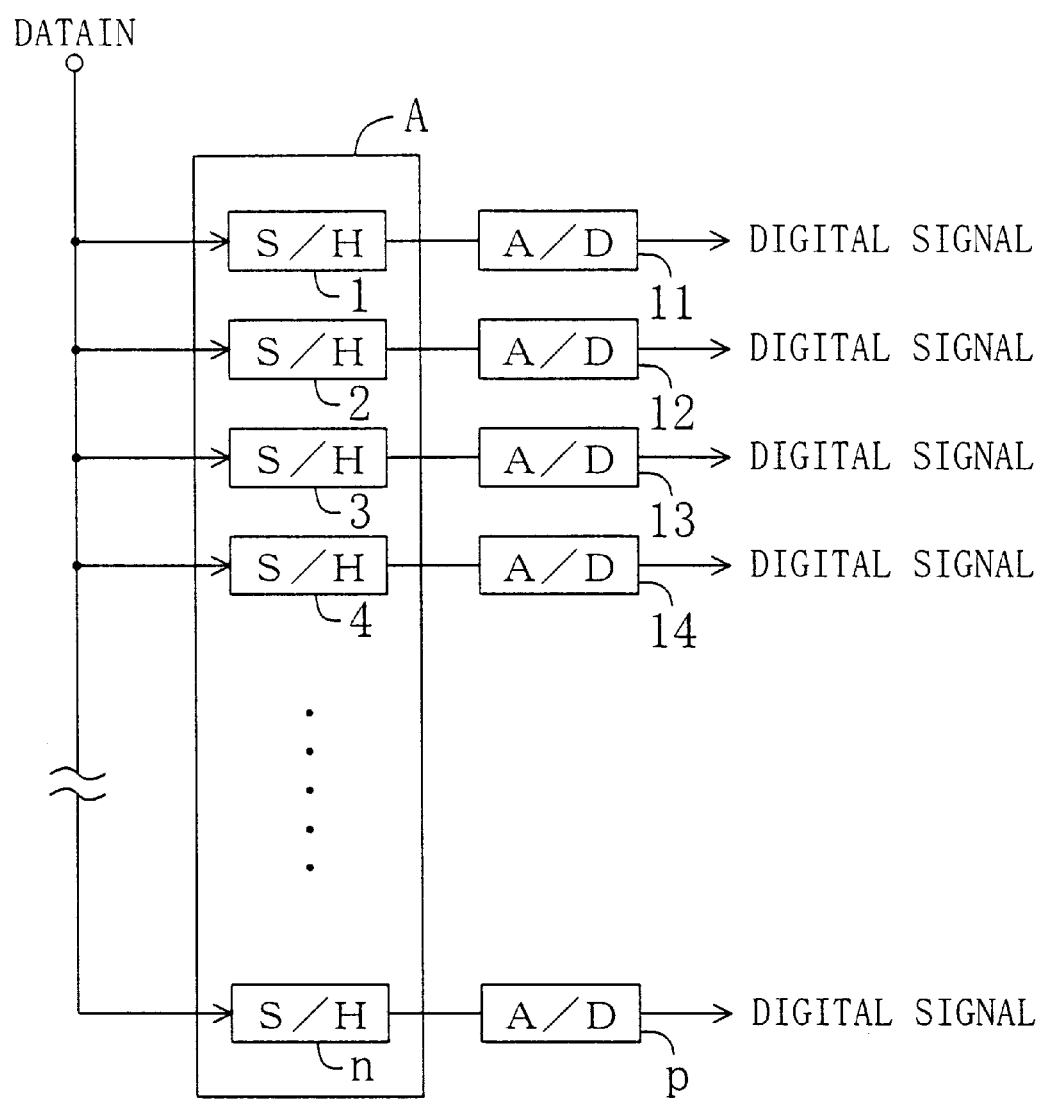
FIG. 2 illustrates a schematic overall arrangement for another circuit to which the inventive semiconductor control unit is applicable.

In the example illustrated in FIG. 1, the inventive semiconductor control unit A is applied to the W-CDMA matched filter for cellular phones. However, the present invention is not limited thereto. For example, the present invention is also applicable to a circuit shown in FIG. 2, in which an analog input signal received at the input terminal DATAIN is sequentially sampled and held by the sample-and-hold circuits 1 through n and then converted by the same number n of A/D converters 11, 12, 13, 14, . . . , p into digital signals. Alternatively, the present invention is also applicable to a charge coupled device (CCD).

Figure 3:
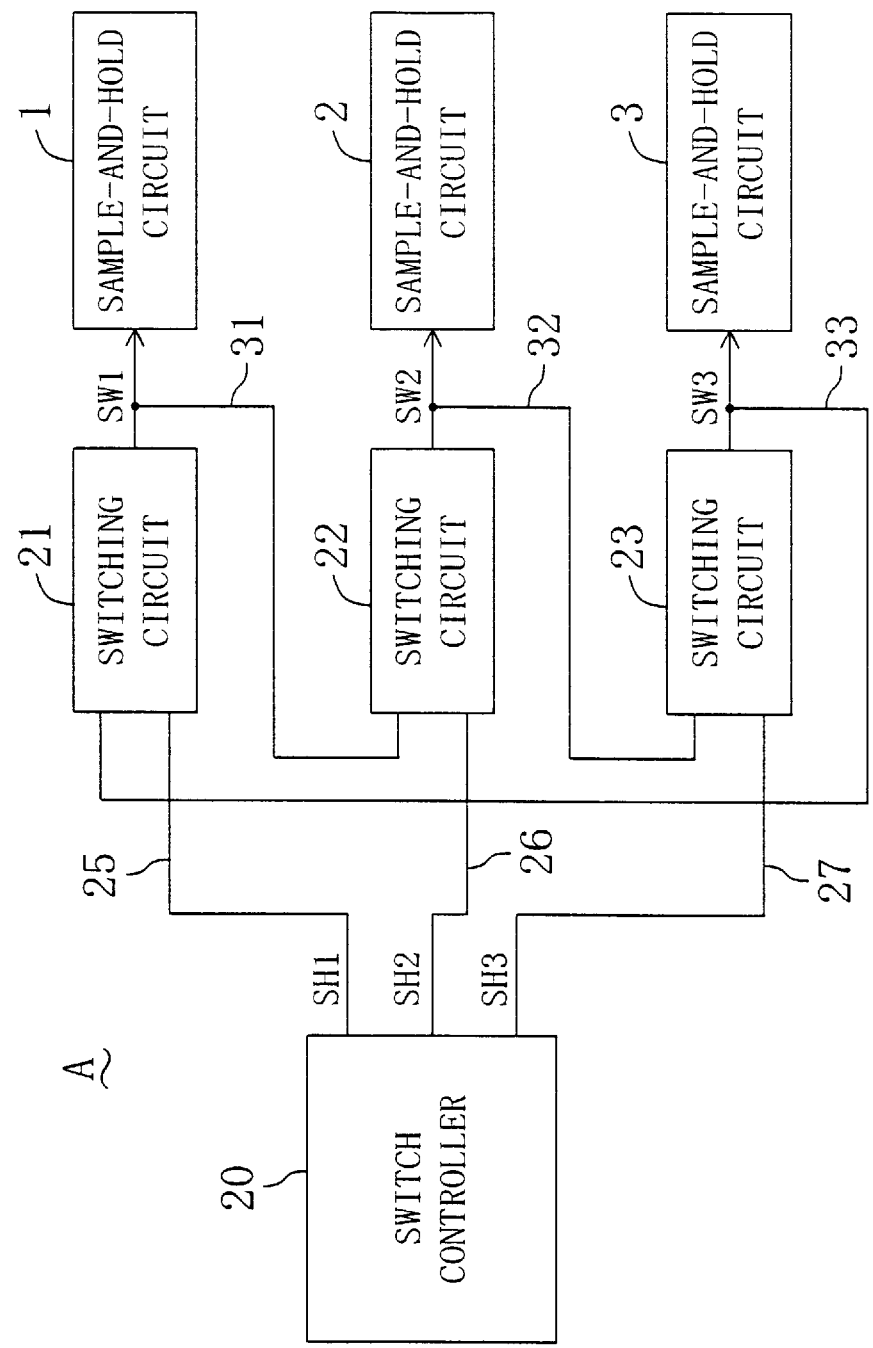
FIG. 3 is a block diagram illustrating an overall arrangement for a semiconductor control unit according to a first embodiment of the present invention.

Next, the internal configuration of the semiconductor control unit A will be described with reference to FIG. 3. As shown in FIG. 3, the control unit A includes a number of sample-and-hold circuits 1, 2 and 3, a switch controller 20 and the same number of switching circuits 21, 22 and 23 associated with the sample-and-hold circuits 1, 2 and 3, respectively. In the illustrated embodiment, the number of the sample-and-hold circuits or switching circuits provided is supposed to be three for the sake of simplicity.

As shown in FIG. 3, the switch controller 20 is connected to the three sample-and-hold circuits 1, 2 and 3 through signal lines 25, 26 and 27, respectively. The switch controller 20 sequentially outputs switch control signals SH1, SH2 and SH3 as clock signals through the signal lines 25, 26 and 27 to the sample-and-hold circuits 1, 2 and 3 to get the data stored in one of the sample-and-hold circuits 1, 2 and 3 after another. That is to say, each of the switch control signals SH1, SH2 and SH3 is high while the data should be stored in its associated sample-and-hold circuit 1, 2 or 3. Also, the switch control signals SH1, SH2 and SH3 are repeatedly output in this order. Specifically, after the third switch control signal SH3 has been output, the first switch control signal SH1 will be output again. The switching circuits 21, 22 and 23 are placed on the signal lines 25, 26 and 27, respectively. In addition, the first and second switching circuits 21 and 22 are connected together via another signal line 31, the second and third switching circuits 22 and 23 via still another signal line 32 and the third and first 23 and 21 via yet another signal line 33.

Figure 4:
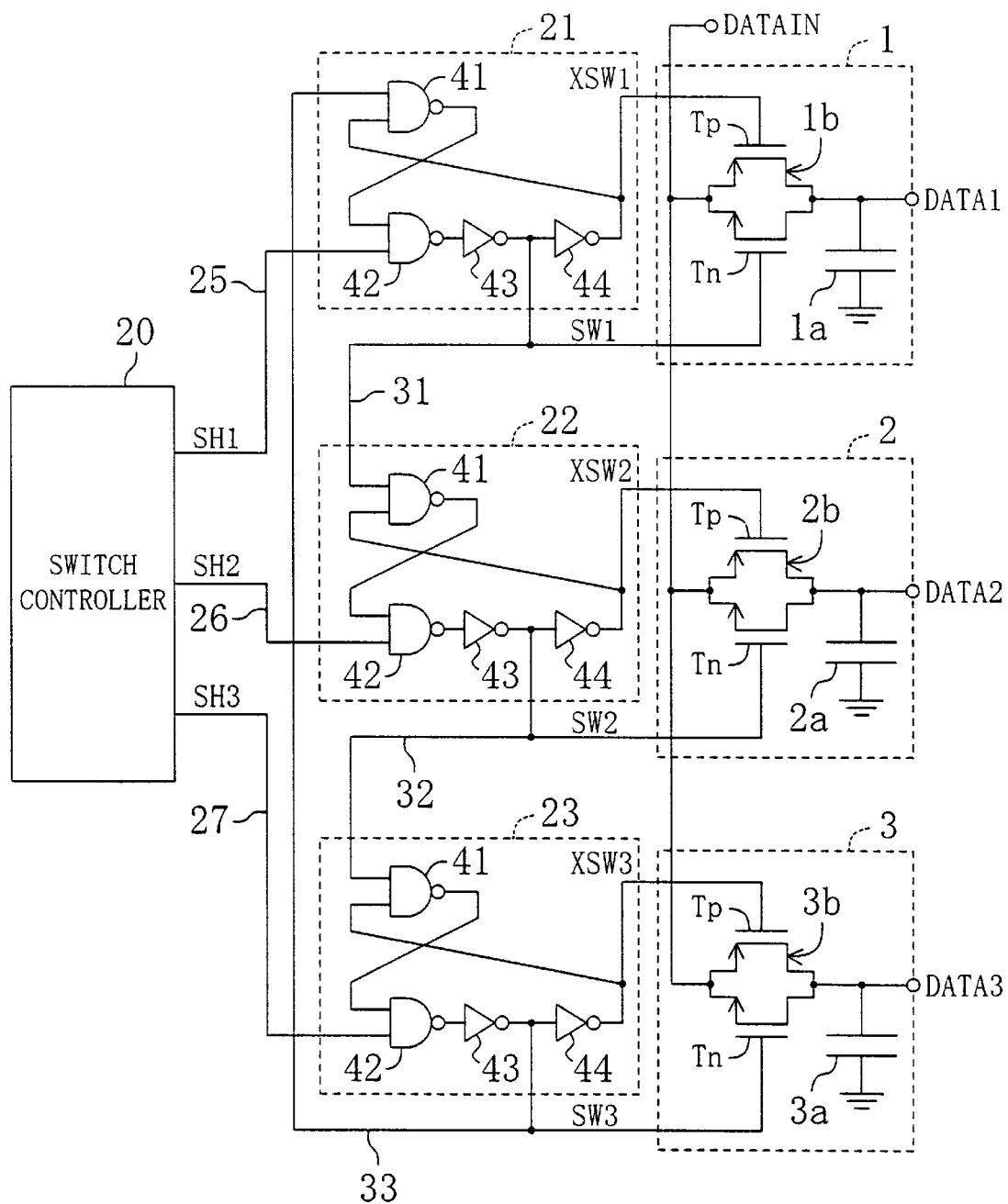
FIG. 4 illustrates internal configurations for the sample-and-hold and switching circuits included in the semiconductor control unit shown in FIG. 3.

FIG. 4 illustrates internal configurations for the sample-and-hold circuits 1, 2 and 3 and the switching circuits 21, 22 and 23. As shown in FIG. 4, the three sample-and-hold circuits 1, 2 and 3 are arranged in parallel with each other to have their capacitance coupled. The first sample-and-hold circuit 1 includes: a capacitor 1a for storing the data therein; and a CMOS switch 1b, which is a parallel connection of p- and n-channel MOS transistors Tp and Tn. The CMOS switch 1b is placed between the input terminal DATAIN and the capacitor 1a. Also, the second and third sample-and-hold circuits 2 and 3 each include a capacitor 2a, 3a and a CMOS switch 2b, 3b. The data, which has been sampled and held in the capacitors 1a, 2a and 3a of the circuits 1, 2 and 3, is output to, and processed by, a data processor (not shown) through the output terminals DATA1, DATA2 and DATA3 of the circuits 1, 2 and 3, respectively. The detailed description of the data processing will be omitted herein because that is not among the essential features of the present invention.

Each of the first, second and third switching circuits 21, 22 and 23 has the same internal configuration and has their components identified by the same reference numerals. Thus, the internal configuration of the first switching circuit 21 alone will be detailed below and the description of the other switching circuits 22 and 23 will be omitted herein.

As shown in FIG. 4, the first switching circuit 21 includes first and second NAND gates 41 and 42 and first and second inverters 43 and 44. The first NAND gate 41 receives a signal output from the third switching circuit 23 through the signal line 33 and an output signal of the second inverter 44. The second NAND gate 42 receives an output signal of the first NAND gate 41 and the first switch control signal SH1 output from the switch controller 20. The first inverter 43 receives an output signal of the second NAND gate 42. And the second inverter 44 receives an output signal of the first inverter 43. Accordingly, the first and second NAND gates 41 and 42 together constitutes a set-reset latch, in which the output of one of the gates is connected to one of the inputs of the other. Instead of the first switch control signal SH1, the output signals SW1 and XSW1 of the first and second inverters 43 and 44 are output as a differential switch control signal to the CMOS switch 1b of its associated sample-and-hold circuit 1. The output signal of the first inverter 43, or the L-level output thereof (i.e., CLOSED signal), is output, as a state signal representing the ON state of the CMOS switch 1b of the sample-and-hold circuit 1, to the first NAND gate 41 of the second switching circuit 22 through the signal line 31.

According to the present invention, the two adjacent switching circuits 21 and 22 are placed in close proximity and the wire length of the signal line 31 connecting these circuits 21 and 22 together is made as short as possible. In the same way, the two adjacent switching circuits 22 and 23 are also placed in close proximity and the wire length of the signal line 32 connecting these circuits 22 and 23 together is made as short as possible, too.

Hereinafter, it will be described how the semiconductor control unit with such a configuration operates.

Figure 5:
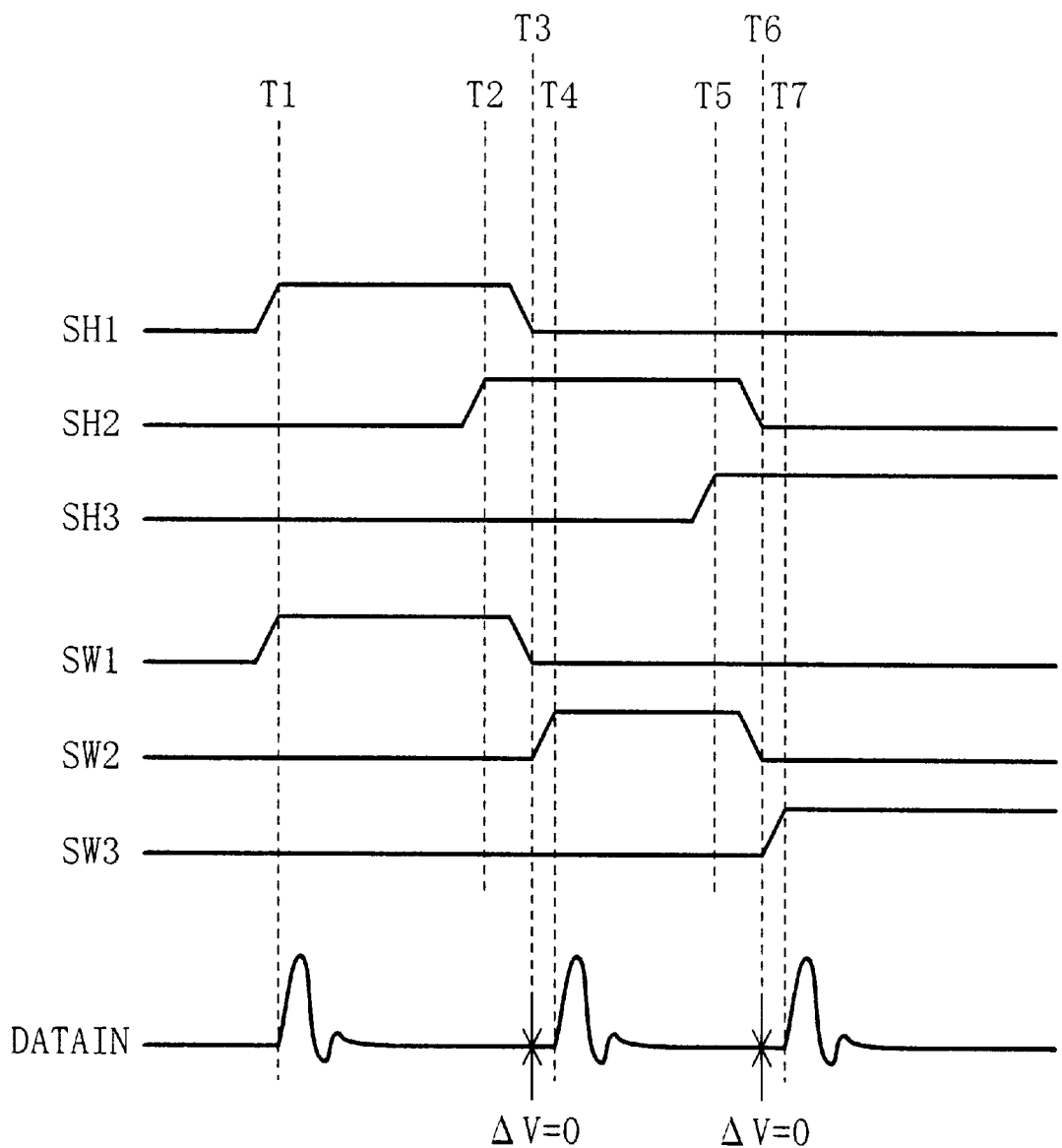
FIG. 5 is a timing diagram illustrating how the inventive semiconductor control unit operates.

A data signal is received at the input terminal DATAIN. Then, a switch control signal SH1, SH2 or SH3, associated with a sample-and-hold circuit 1, 2 or 3 in which the data signal should be sampled and held, is output from the switch controller 20 as an H-level signal to the sample-and-hold circuit 1, 2 or 3. Suppose the first switch control signal SH1 has risen to the H level, for example. FIG. 5 is a timing diagram corresponding to this situation.

As shown in FIG. 5, the switch control signal SW3, output from the third switching circuit 23, is low at a time T1 when the switch control signal SH1 reaches the H level. Thus, the switch control signal SW1 rises to the H level because the first switching circuit 21 operates as a set-reset latch. As a result, the CMOS switch 1b of the first sample-and-hold circuit 1 opens and the data received at the input terminal DATAIN starts being stored into the capacitor 1a.

Next, at a time T2, the second switch control signal SH2 reaches the H level before the first switch control signal SH1 falls to the L level at a time T3. However, since the switch control signal SW1 is still at the H level, the switch control signal SW2 output from the second switching circuit 22 is kept low. Thus, the CMOS switch 2b of the second sample-and-hold circuit 2 does not open yet.

Subsequently, when the first switch control signal SH1 finally falls to the L level at the time T3, the switch control signal SW1 output from the first switching circuit 21 also falls to the L level. As a result, the data received at the input terminal DATAIN is sampled and held in the capacitor 1*a* of the first sample-and-hold circuit 1 and the CMOS switch 1*b* closes. At this time, the CMOS switch 2*b* of the second sample-and-hold circuit 2 has not opened yet as described above. Thus, no switching noise is caused by the switch 2*b* (i.e., switching noise Δv=0 as shown in FIG. 5).

At the time T3, the L-level switch control signal (i.e., the CLOSED signal) SW1 is output from the first switching circuit 21 to the second switching circuit 22 through the signal line 31. Responsive to the L-level signal SW1, the switch control signal SW2 of the second switching circuit 22 rises to the H level at a time T4. As a result, the CMOS switch 2*b* of the second sample-and-hold circuit 2 opens at last and the data at the input terminal DATAIN starts being stored into the capacitor 2*a*. Although some switching noise is caused through the switching of the CMOS switch 2*b* at this time, the sample-and-hold operation of the circuit 1 is not affected by this noise at all, because the operation is already finished.

In the same way, although the third switch control signal SH3 reaches the H level at a time T5, the switch control signal SW2 of the second switching circuit 22 is still at the H level at the time T5. Thus, the switch control signal SW3 output from the third switching circuit 23 is kept low responsive to the H-level control signal SW2. Thus, the CMOS switch 3*b* of the third sample-and-hold circuit 3 does not open yet. Subsequently, when the second switch control signal SH2 finally falls to the L level at a time T6, the switch control signal SW2 output from the second switching circuit 22 also falls to the L level. As a result, the data received at the input terminal DATAIN is sampled and held in the capacitor 2*a* of the second sample-and-hold circuit 2 and the CMOS switch 2*b* closes. At this time, the CMOS switch 3*b* of the third sample-and-hold circuit 3 has not opened yet as described above. Thus, no switching noise is caused by the switch 3*b* (i.e., switching noise Δv=0 as shown in FIG. 5).

At the time T6, the L-level switch control signal (i.e., the CLOSED signal) SW2 is output from the second switching circuit 22 to the third switching circuit 23 through the signal line 32. Responsive to the L-level signal SW2, the switch control signal SW3 of the third switching circuit 23 rises to the H level at a time T7. As a result, the CMOS switch 3*b* of the third sample-and-hold circuit 3 opens at last and the data at the input terminal DATAIN starts being stored into the capacitor 3*a*. Although some switching noise is caused through the switching of the CMOS switch 3*b* at this time, the sample-and-hold operation of the circuit 2 is not affected by the noise at all, because the operation is already finished.

In this manner, while one of the sample-and-hold circuits is sampling and holding the data with its CMOS switch opened, no other sample-and-hold circuit is allowed to open its CMOS switch. Thus, no switching noise interferes with accurate sampling and holding of the data.

Since the second inverter 44 is provided for the first switching circuit 21, the transfer of the switch control signal XSW1 to its associated sample-and-hold circuit 1 is slightly delayed. However, it is still possible to make the second switching circuit 22 output the differential switch control signal SW2, XSW2 to the second sample-and-hold circuit 2 after the CMOS switch 1*b* of the first sample-and-hold circuit 1 has closed. Thus, the CMOS switch 2*b* of the second sample-and-hold circuit 2 will never open until the data has been held in the first sample-and-hold circuit 1.

Embodiment 2

Figure 6:
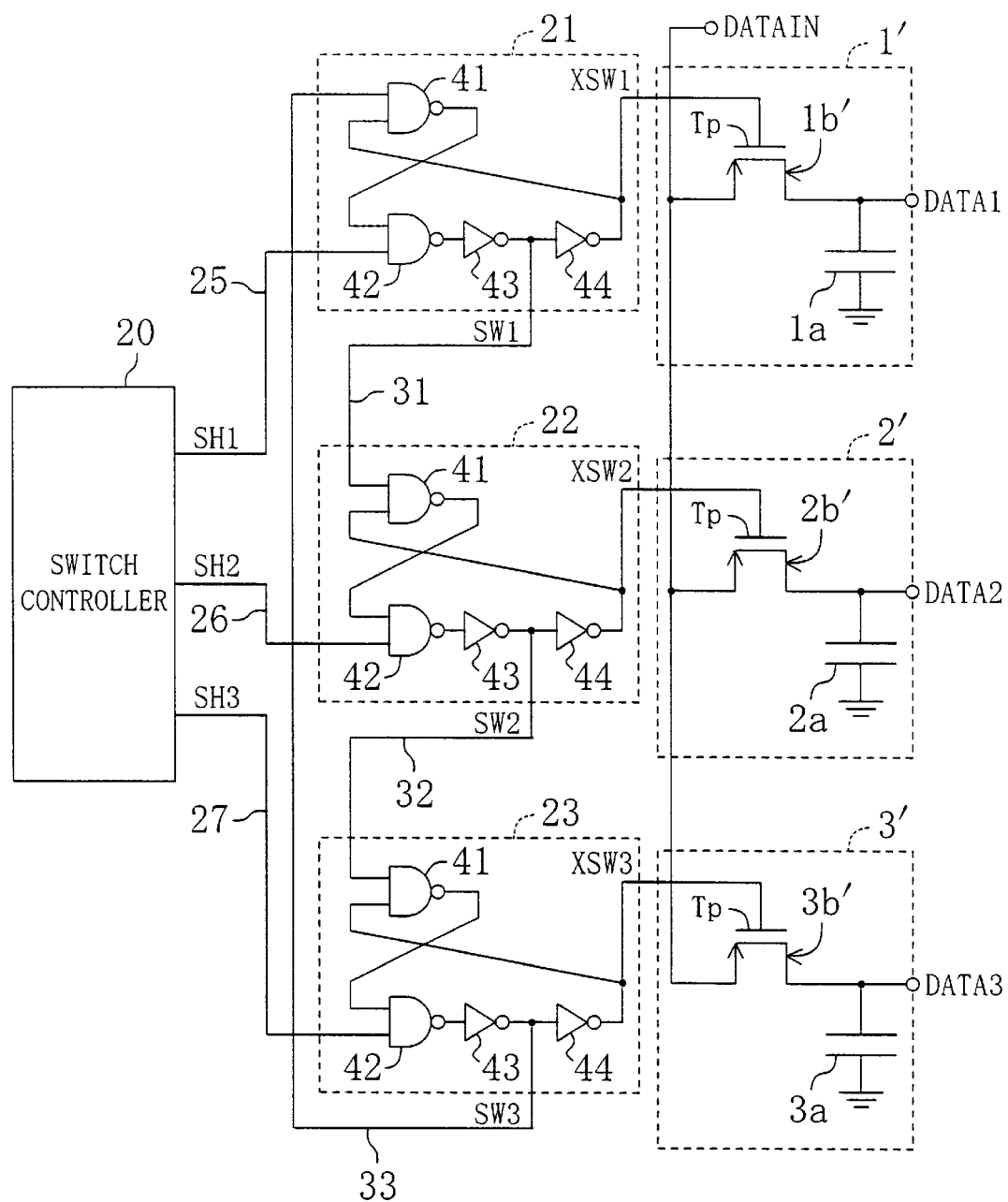
FIG. 6 illustrates an overall arrangement for a semiconductor control unit according to a second embodiment of the present invention.

Next, a semiconductor control unit according to a second embodiment of the present invention will be described with reference to FIG. 6. The control unit shown in FIG. 6 is different from the counterpart of the first embodiment shown in FIG. 4 only in the internal configuration of the sample-and-hold circuits 1, 2 and 3. Specifically, according to the second embodiment, the sample-and-hold circuits 1', 2' and 3' each include a switch 1*b*', 2*b*' and 3*b*' consisting of just a p-channel MOS transistor Tp as shown in FIG. 6. The switching circuits 21, 22 and 23 have the same configuration as the counterparts of the first embodiment. Thus, the output signals XSW1, XSW2 and XSW3 of their second inverters 44 are output as switch control signals to the switches 1*b*', 2*b*' and 3*b*' of the associated sample-and-hold circuits 1', 2' and 3', respectively. The semiconductor control unit of the second embodiment operates in the same way as the control unit of the first embodiment, and the description thereof will be omitted herein.

Embodiment 3

Figure 7:
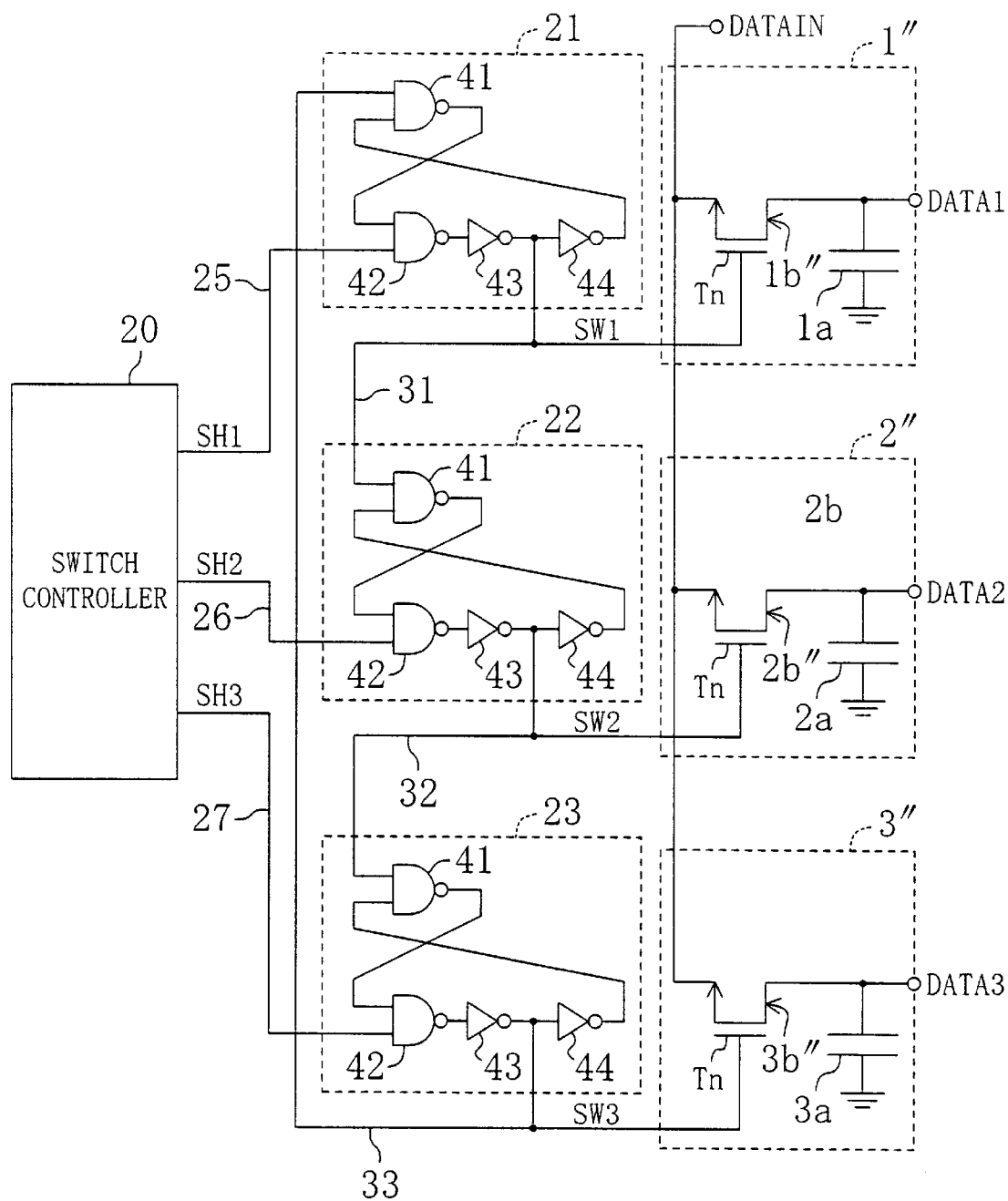
FIG. 7 illustrates an overall arrangement for a semiconductor control unit according to a third embodiment of the present invention.

Next, a semiconductor control unit according to a third embodiment of the present invention will be described with reference to FIG. 7. According to the third embodiment, the sample-and-hold circuits 1", 2" and 3" each include a switch 1*b*", 2*b*" and 3*b*" consisting of just an n-channel MOS transistor Tn as shown in FIG. 7. The switching circuits 21, 22 and 23 have the same configuration as the counterparts of the first embodiment. Thus, the output signals SW1, SW2 and SW3 of their first inverters 43 are output as switch control signals to the switches 1*b*", 2*b*" and 3*b*" of the associated sample-and-hold circuits 1", 2" and 3", respectively. The semiconductor control unit of the third embodiment also operates in the same way as the control unit of the first embodiment, and the description thereof will be omitted herein.

Embodiment 4

Figure 8:
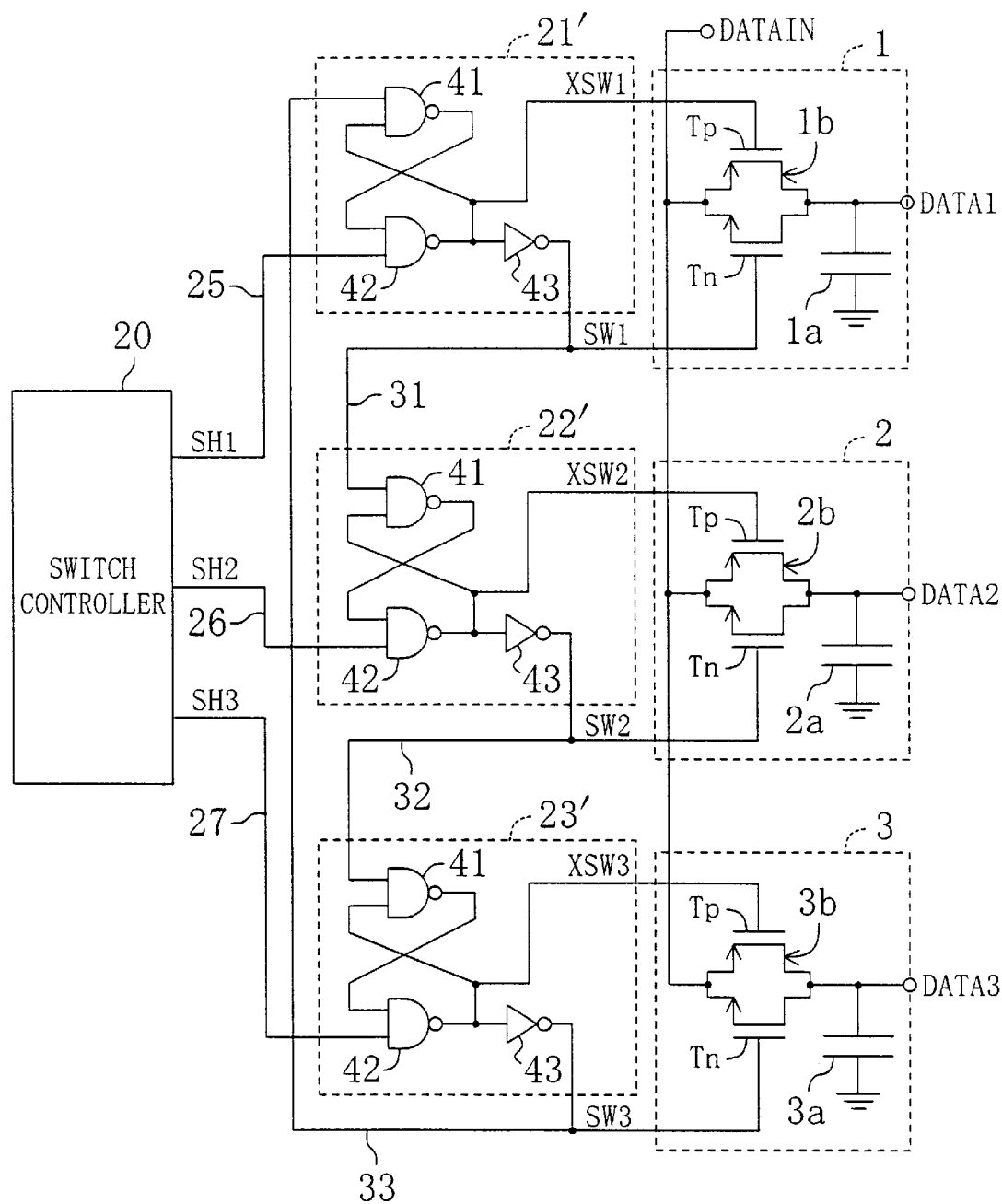
FIG. 8 illustrates an overall arrangement for a semiconductor control unit according to a fourth embodiment of the present invention.

Next, a semiconductor control unit according to a fourth embodiment of the present invention will be described with reference to FIG. 8. According to the fourth embodiment, the switching circuits have a different configuration from that of the foregoing embodiments. Specifically, as shown in FIG. 8, the switching circuits 21', 22' and 23' each include just one inverter 43 but no second inverter 44 unlike the first embodiment shown in FIG. 4. Thus, the output signals XSW1, XSW2 and XSW3 of the second NAND gates 42 of the switching circuits 21', 22' and 23' are output as switch control signals to the switches 1*b*, 2*b* and 3*b* of the associated sample-and-hold circuits 1, 2 and 3, respectively.

Thus, according to the fourth embodiment, the area of the switching circuits 21', 22' and 23' can be smaller than the counterparts of the first embodiment shown in FIG. 4, because the inverters 44 are not provided for the circuits 21', 22' and 23'.

Embodiment 5

Figure 9:
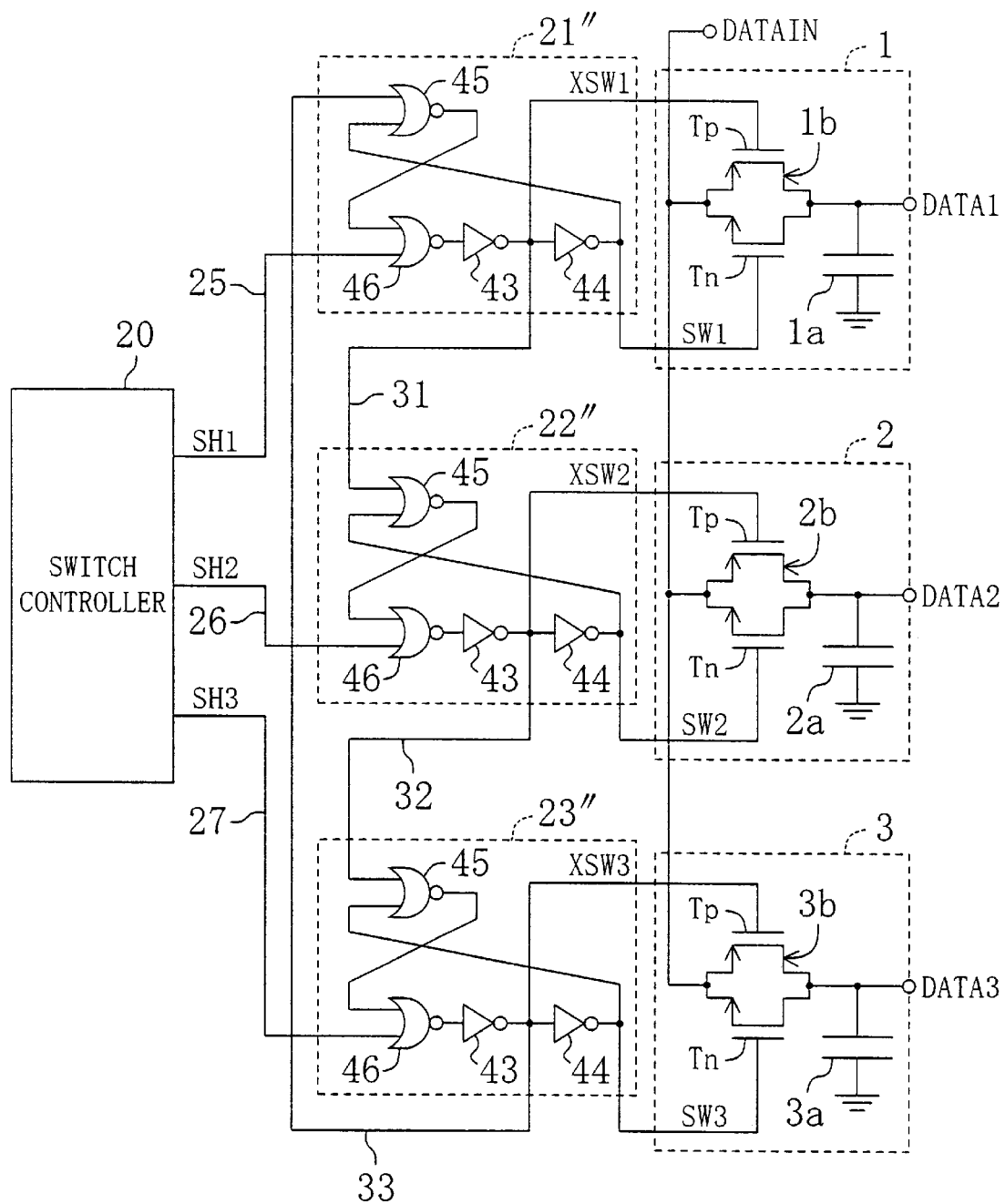
FIG. 9 illustrates an overall arrangement for a semiconductor control unit according to a fifth embodiment of the present invention.

Next, a semiconductor control unit according to a fifth embodiment of the present invention will be described with reference to FIG. 9. According to the fifth embodiment, the switching circuits have a different configuration from those of the foregoing embodiments. Specifically, as shown in FIG. 9, the switching circuits 21", 22" and 23" each include first and second NOR gates 45 and 46 in place of the first and second NAND gates 41 and 42 unlike the first embodiment shown in FIG. 4. This embodiment is effectively applicable to a situation where the CMOS switches 1b, 2b and 3b of the sample-and-hold circuits 1, 2 and 3 should open responsive to L-level switch control signals SH1, SH2 and SH3. The NOR gates 45 and 46 are used herein. Thus, the output signals of the first inverters 43 in the switching circuits 21", 22" and 23" are input to the p-channel MOS transistors Tp in the sample-and-hold circuits 1, 2 and 3. And the output signals of the second inverters 44 in the switching circuits 21", 22" and 23" are input to the n-channel MOS transistors Tn in the sample-and-hold circuits 1, 2 and 3.

Embodiment 6

Figure 10:
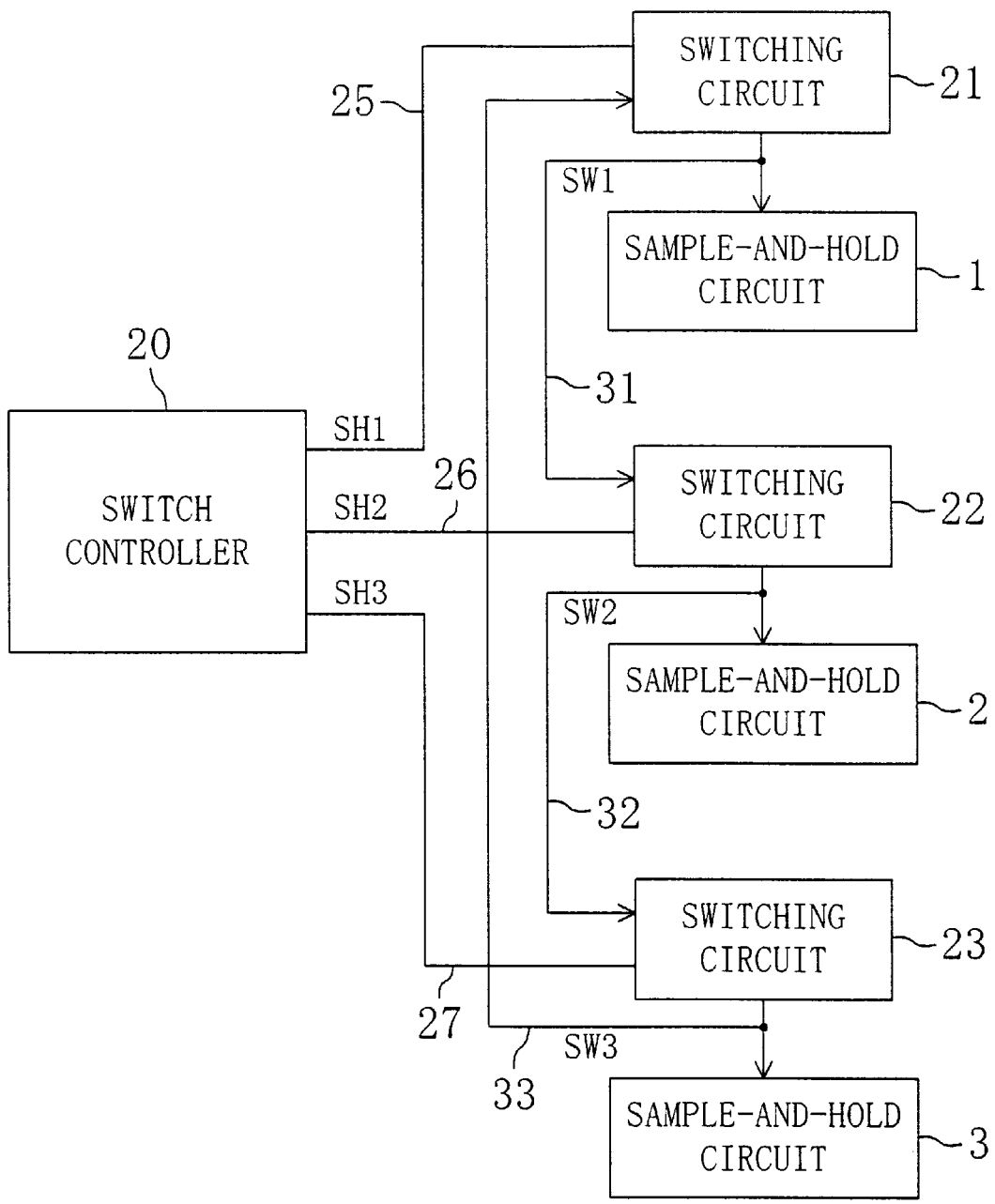
FIG. 10 illustrates an overall arrangement for a semiconductor control unit according to a sixth embodiment of the present invention.

Next, a semiconductor control unit according to a sixth embodiment of the present invention will be described with reference to FIG. 10. According to the sixth embodiment, the sample-and-hold circuits are placed relative to the switching circuits. Specifically, as shown in FIG. 10, the first sample-and-hold circuit 1 is placed between its associated first switching circuit 21 and the second switching circuit 22 that is connected to the first switching circuit 21 through the signal line 31. In the same way, the second sample-and-hold circuit 2 is placed between the second and third switching circuits 22 and 23 that are connected together via the signal line 32.

Thus, in this embodiment, part of the CLOSED signal (i.e., state signal) propagation path from the first switching circuit 21 to its associated sample-and-hold circuit 1 can be shared with the CLOSED signal propagation path from the first to second switching circuit 21 to 22 via the signal line 31. Also, part of the CLOSED signal propagation path from the second switching circuit 22 to its associated sample-and-hold circuit 2 can be shared with the CLOSED signal propagation path from the second to third switching circuit 22 to 23 via the signal line 32. Accordingly, once the switch has closed in the first or second sample-and-hold circuit 1 or 2, the second or third switching circuit 22 or 23 can be quickly informed of the CLOSED state via the signal line 31 or 32.

In FIG. 10, internal configurations for the sample-and-hold circuits 1, 2 and 3. and the switching circuits 21, 22 and 23 are not illustrated. The internal configurations may be any of those illustrated in FIGS. 4, 6, 7, 8 and 9 but are not limited thereto.

Embodiment 7

Next, a semiconductor control unit according to a seventh embodiment of the present invention will be described with reference to FIG. 11. The seventh embodiment is a further modification to the sixth embodiment.

Figure 11:
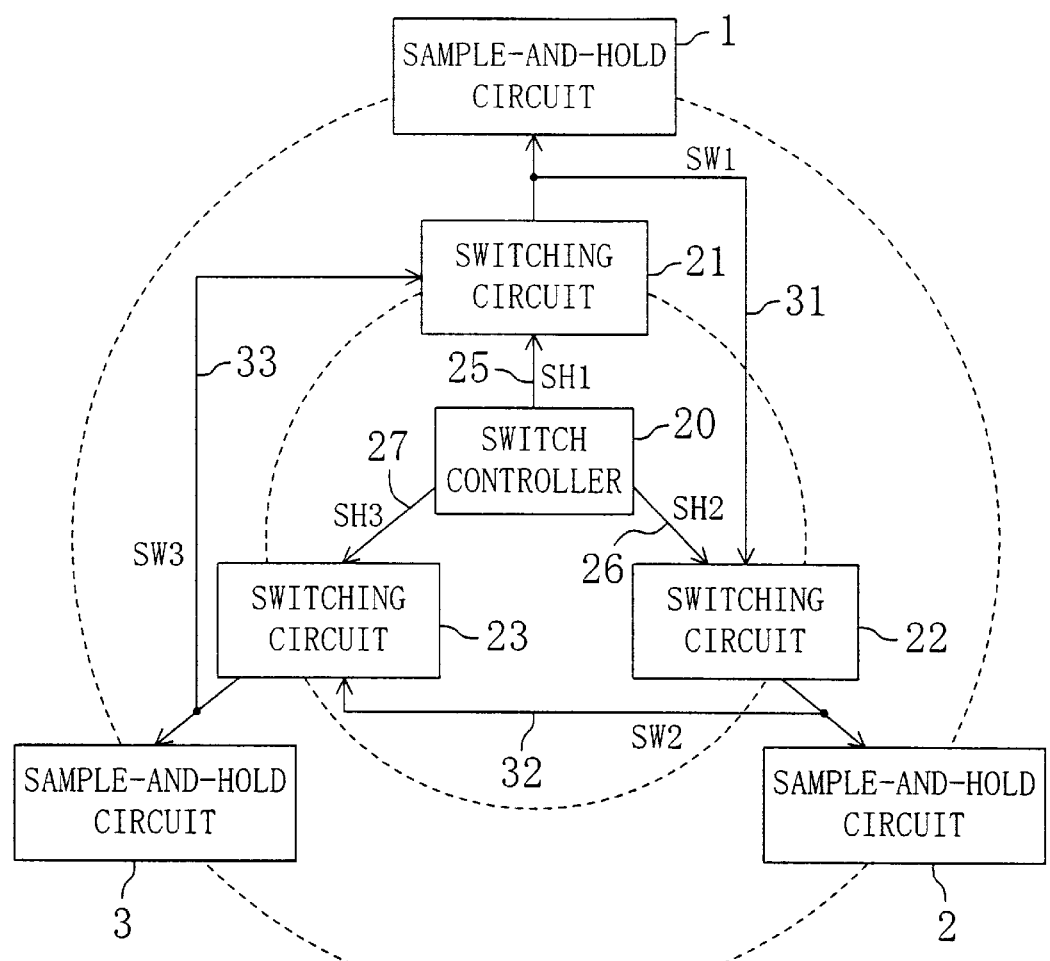
FIG. 11 illustrates an overall arrangement for a semiconductor control unit according to a seventh embodiment of the present invention.
Figure 12:
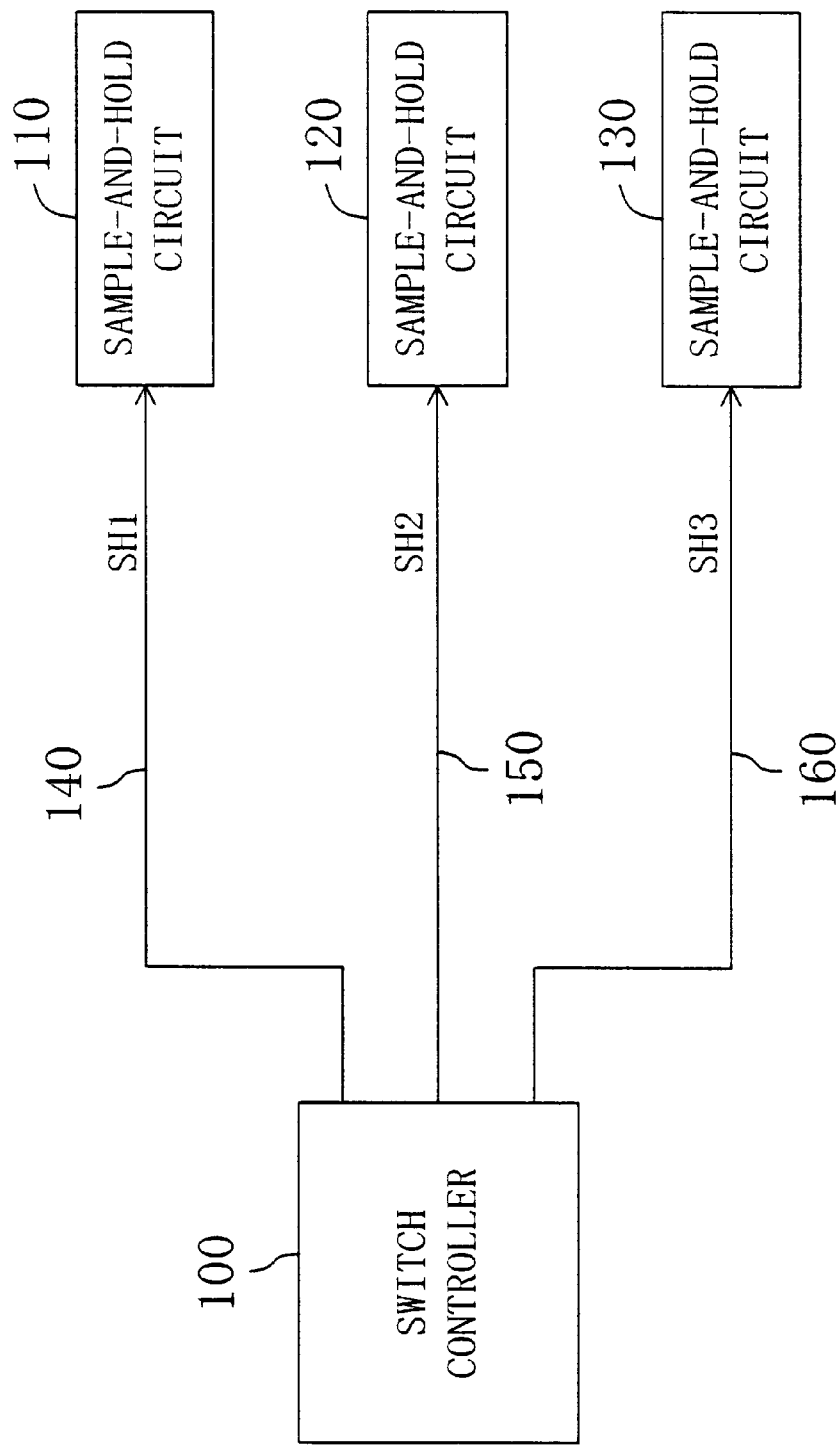
FIG. 12 is a block diagram illustrating an arrangement for a known semiconductor control unit including sample-and-hold circuits.
Figure 13:
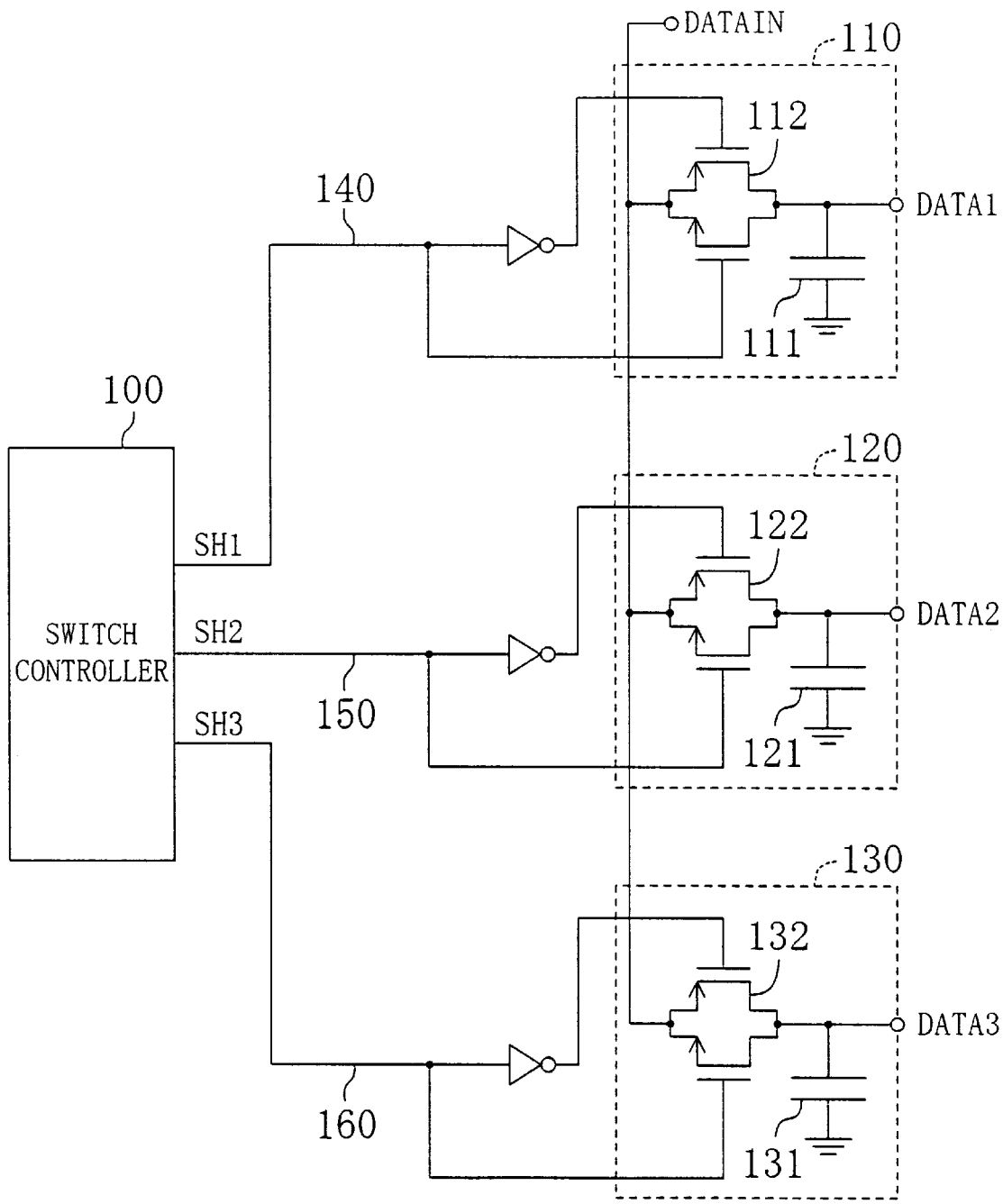
FIG. 13 is a circuit diagram illustrating internal configurations for the sample-and-hold circuits included in the semiconductor control unit shown in FIG. 12.
Figure 14:
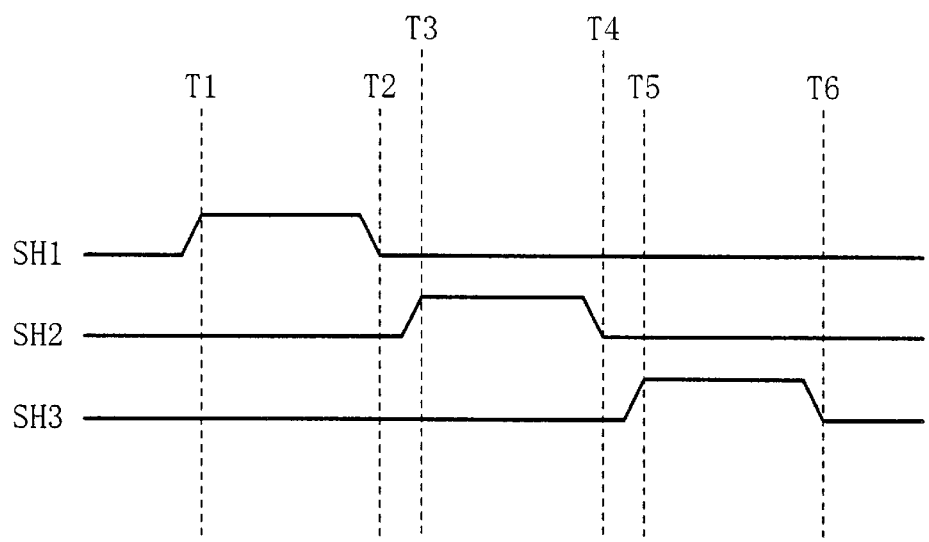
FIG. 14 is a timing diagram illustrating how the known semiconductor control unit operates.
Figure 15:
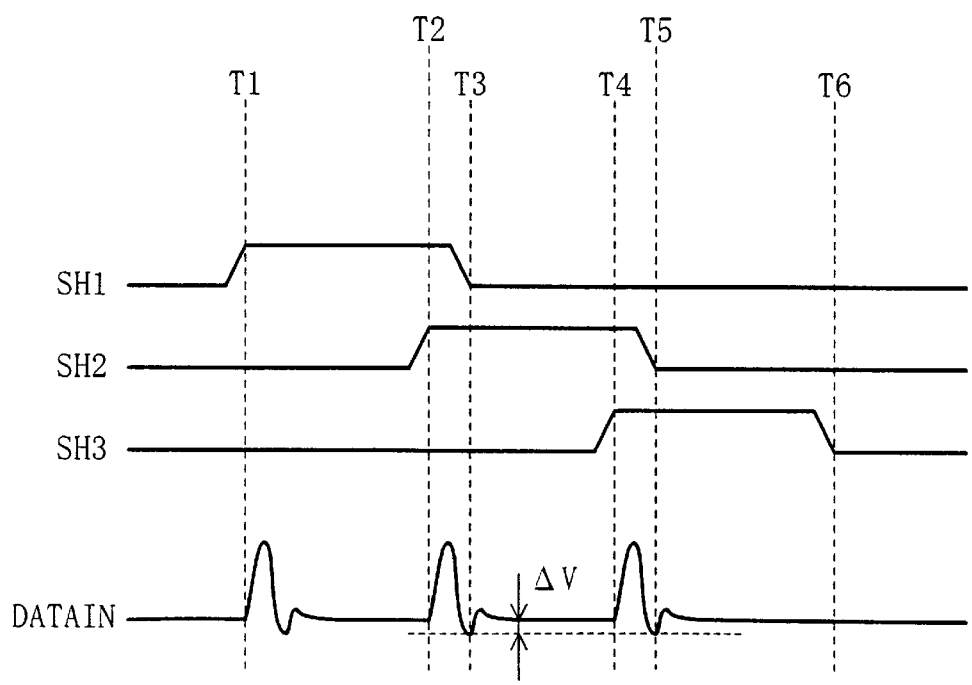
FIG. 15 is a timing diagram illustrating how the known semiconductor control unit operates if a signal propagation delay is caused in the unit.

Specifically, as shown in FIG. 11, the three switching circuits 21, 22 and 23 are arranged around the switch controller 20 to form an inner circle. The three sample-and-hold circuits 1, 2 and 3 are also arranged around the switch controller 20 to form an outer circle. Accordingly, these three switching circuits 21, 22 and 23 are spaced apart from each other by almost an equal distance. In other words, the wire lengths of the three signal lines 31, 32 and 33 connecting these switching circuits 21, 22 and 23 together are also substantially equal to each other. That is to say, since the wire lengths are equal, it will take substantially the same amount of time to transmit a signal from each one of the switching circuits to another. Accordingly, the CLOSED signal (i.e., state signal) can be transmitted in the same amount of time, no matter whether the signal is sent from the first to the second switching circuit 21 to 22 via the line 31, from the second to the third 22 to 23 via the line 32 or from the third to the first 23 to 21 via the line 33.

In the foregoing embodiments, the number of the sample-and-hold circuits or switching circuits arranged in parallel is supposed to be three for illustrative purposes only. Actually, though, the present invention is also implementable even if the number is four or a much greater number. e.g., 64 or 128.

Also, the switch controller 20 and the signal lines 25, 26, 27, 31, 32 and 33 are preferably placed or routed automatically using a hardware description language.

What is claimed is:

1. A semiconductor control unit comprising:
multiple sample-and-hold circuits for storing externally input data therein, each said sample-and-hold circuit including a switch for selectively passing the data therethrough;
a controller, connected to the sample-and-hold circuits through respective signal lines, for sequentially outputting switch control signals to the sample-and-hold circuits to get the data stored in one of the sample-and-hold circuits after another; and
the same number of switching circuits as the sample-and-hold circuits, each said switching circuit being provided for associated one of the signal lines,
wherein each said switching circuit receives not only a first one of the switch control signals from the controller through its associated signal line but also a state signal from another one of the switching circuits that received a second one of the switch control signals that precedes the first switch control signal, and is not allowed to output the first switch control signal to associated one of the sample-and-hold circuits while the switch of another one of the sample-and-hold circuits that received the second switch control signal is opened.

2. The unit of claim 1, wherein each said switching circuit does not output the first switch control signal to the associated sample-and-hold circuit until the switching circuit receives a CLOSED signal as the state signal from the another one of the switching circuits that received the second switch control signal.

3. The unit of claim 1, wherein each said switching circuit comprises:
first and second NAND gates; and
first and second inverters,
wherein the first NAND gate receives not only an output signal of the another one of the switching circuits that received the second switch control signal but also an output signal of the second inverter, and
wherein the second NAND gate receives an output signal of the first NAND gate and the first switch control signal, and
wherein the first inverter receives an output signal of the second NAND gate, and
wherein the second inverter receives an output signal of the first inverter, and
wherein output signals of the first and second inverters are output in pairs as the first switch control signal to the associated sample-and-hold circuit, and
wherein the output signal of the first inverter is output as the state signal.

4. The unit of claim 1, wherein each said switching circuit comprises:
first and second NAND gates; and
an inverter, wherein the first NAND gate receives not only an output signal of the another one of the switching circuits that received the second switch control signal but also an output signal of the second NAND gate, and wherein the second NAND gate receives an output signal of the first NAND gate and the first switch control signal, and wherein the inverter receives an output signal of the second NAND gate, and wherein the output signal of the second NAND gate and an output signal of the inverter are output in pairs as the first switch control signal to the associated sample-and-hold circuit, and wherein the output signal of the inverter is output as the state signal.

5. The unit of claim 1, wherein each said switching circuit comprises:

first and second NOR gates; and first and second inverters, wherein the first NOR gate receives not only an output signal of the another one of the switching circuits that received the second switch control signal but also an output signal of the second inverter, and wherein the second NOR gate receives an output signal of the first NOR gate and the first switch control signal, and wherein the first inverter receives an output signal of the second NOR gate, and wherein the second inverter receives an output signal of the first inverter, and wherein output signals of the first and second inverters are output in pairs as the first switch control signal to the associated sample-and-hold circuit, and wherein the output signal of the first inverter is output as the state signal.

6. The unit of claim 1 or 2, wherein each said sample-and-hold circuit comprises:

a capacitor for storing the data therein; and a CMOS transistor, which is placed between an input terminal at which the data is received and the capacitor and functions as the switch.

7. The unit of claim 1 or 2, wherein each said sample-and-hold circuit comprises:

a capacitor for storing the data therein; and a p-channel MOS transistor, which is placed between an input terminal at which the data is received and the capacitor and functions as the switch.

8. The unit of claim 1 or 2, wherein each said sample-and-hold circuit comprises:

a capacitor for storing the data therein; and an n-channel MOS transistor, which is placed between an input terminal at which the data is received and the capacitor and functions as the switch.

9. The unit of claim 1 or 2, wherein each said switching circuit is placed closely to an adjacent one of the switching circuits.

10. The unit of claim 1 or 2, wherein all of the sample-and-hold circuits, but one, are each placed between the associated switching circuit and another one of the switching circuits that receives the state signal from the former switching circuit, the one sample-and-hold circuit being adjacent to just the associated switching circuit thereof.

11. The unit of claim 1 or 2, wherein the switching circuits are arranged in such a manner that each said switching circuit is spaced apart from another one of the switching circuits that receives the state signal from the former switching circuit by a substantially equal distance.

12. The unit of claim 1, wherein the sample-and-hold circuits are used for a matched filter, and wherein outputs of the sample-and-hold circuits are respectively input to multiple multipliers included in the matched filter.

* * * * *